United States Patent [19]

Gardner et al.

[11] Patent Number: 5,070,047
[45] Date of Patent: Dec. 3, 1991

[54] DIELECTRIC COMPOSITIONS

[75] Inventors: Robert D. Gardner, Warrensville Hts.; Dineen M. Hopp, Twinsburg, both of Ohio; Aziz S. Shaikh, Ventura, Calif.; Gordon J. Roberts, Parma, Ohio

[73] Assignee: Ferro Corporation, Cleveland, Ohio

[21] Appl. No.: 640,590

[22] Filed: Jan. 14, 1991

Related U.S. Application Data

[63] Continuation of Ser. No. 377,551, Jul. 13, 1989, abandoned, which is a continuation-in-part of Ser. No. 221,105, Jul. 19, 1988.

[51] Int. Cl.$^5$ ................................................ C03C 8/22
[52] U.S. Cl. ...................................... 501/16; 501/20; 501/55; 501/72
[58] Field of Search .................. 501/19, 20, 69, 70, 501/73, 79, 16, 55, 72; 156/89

[56] References Cited

U.S. PATENT DOCUMENTS

| | | | |
|---|---|---|---|
| 3,927,238 | 12/1975 | DiMarcello | 428/336 |
| 4,084,975 | 4/1978 | Faust | 106/48 |
| 4,084,976 | 4/1978 | Hinton | 501/26 |
| 4,369,220 | 1/1983 | Prabhu et al. | 428/209 |
| 4,392,180 | 7/1983 | Nair | 361/321 |
| 4,396,682 | 8/1983 | Mohri et al. | 428/428 |
| 4,435,511 | 3/1984 | Weaver | 501/22 |
| 4,547,467 | 10/1985 | Barth et al. | 501/26 |
| 4,547,625 | 10/1985 | Tosaki et al. | 174/68.5 |
| 4,634,634 | 1/1987 | Kondo et al. | 428/432 |
| 4,636,257 | 1/1987 | Baudry et al. | 106/19 |
| 4,654,095 | 3/1987 | Steinberg | 156/89 |
| 4,672,152 | 6/1987 | Shinohara et al. | 174/68.5 |
| 4,752,531 | 6/1988 | Steinberg | 501/20 |
| 4,761,325 | 8/1988 | Kurihara et al. | 428/209 |
| 4,777,092 | 10/1988 | Kawakami et al. | 428/428 |
| 4,816,615 | 3/1989 | Prabhu et al. | 174/68.5 |
| 4,830,988 | 5/1989 | Hang et al. | 501/21 |

FOREIGN PATENT DOCUMENTS

| | | |
|---|---|---|
| 0209776 | 7/1986 | Fed. Rep. of Germany . |
| 0232767 | 1/1987 | Fed. Rep. of Germany . |
| 54154079 | 5/1978 | Japan . |

OTHER PUBLICATIONS

Electro Materials Corp. of America, EMCA Bulletin No. 315, Dielectric System 1300.
"A Practical Sourcebook for Designers, Fabricators, and Users", Charles A. Harper, pp. 7-50-7-63, DuPont Thick Film Dielectric Compositions, 1984.
"Hybrid Microelectronics", University of South Florida, Short Course Notes, p. 77.
"Nitrogen Fireable Dielectrics", Remex Electronic Materials.
Alcoa Product Data Chemicals, "Calcined, Reactive, Tabular Aluminas and Calcium Aluminate Cement", Apr. 30, 1976.

*Primary Examiner*—William R. Dixon, Jr.
*Assistant Examiner*—Paul Marcantoni
*Attorney, Agent, or Firm*—Renner, Otto, Boisselle & Sklar

[57] ABSTRACT

This invention relates to a dielectric composition comprising:
(a) about 30% to about 100% by weight of a glass composition selected from the group consisting of:
 (a-1) a bismuth-free, lead-free or low-lead containing glass composition having a glass transition temperature in the range of about 600° C. to about 800° C.;
 (a-2) a mixture of two bismuth-free, lead-free or low-lead containing glass compositions comprising a first glass composition having a glass transition temperature in the range of about 585° C. to about 620° C. and a second glass composition having a glass transition temperature in the range of about 765° C. to about 815° C.; or
 (a-3) a mixture of three bismuth-free, lead-free or low-lead containing glass compositions comprising a first glass composition having a glass transition temperature in the range of about 585° C. to about 620° C., a second glass composition having a glass transition temperature in the range of about 765° C. to about 815° C., and a third glass composition having a glass transition temperature in the range of about 650° C. to about 720° C.;
(b) up to about 30% by weight of at least one expansion modifier; and
(c) up to about 40% by weight of at least one refractory oxide.

This invention also relates to thick-film dielectric pastes and dielectric tapes comprising the foregoing dielectric composition. The invention also relates alumina base substrates having the foregoing dielectric composition bonded to at least one surface thereof, and to a method of bonding the foregoing dielectric composition to alumina base substrates.

29 Claims, No Drawings

DIELECTRIC COMPOSITIONS

This application is a continuation of copending application Ser. No. 07/377,551 filed July 13, 1989, abandoned, which is a continuation-in-part of U.S. application Ser. No. 221,105, filed July 19, 1988, now abandoned, the disclosure in said prior application being incorporated herein by reference in its entirety.

FIELD OF THE INVENTION

This invention relates to one-, two- or three-glass systems that are useful as dielectric compositions. These dielectric compositions are adapted for use on alumina containing substrates utilized in producing multi-layer hybrid circuits, which are compatible with thick film copper conductor pastes, and which are firable in non-oxidizing atmospheres.

BACKGROUND OF THE INVENTION

The use of dielectrics on suitable substrates in the making of multi-layer hybrid microelectronic components is well known in the electronics art. In practice, such substrates have been fabricated from numerous types of materials, including alumina, beryllia, aluminum nitride, and silicon carbide.

The glass compositions used in connection with thick film dielectric compositions are critical in several respects. In firing the paste onto the substrate the vehicle is evaporated or burned off, and the glass is melted and flows over the surface of the substrate to form a homogeneous surface which should be essentially free of pores or bubbles. In practice, this means that the binder must be substantially completely driven off before the glass melts, or it will "bubble" up through the molten glass leaving pores or entrapped bubbles. If on the other hand the melting point of the glass is too high, the resin portion will be driven off but the film will lack structural integrity.

Most thick film multi-layer hybrid circuits are presently produced using precious metal conductors in combination with compatible dielectric compositions. These dielectric compositions generally contain large percentages of lead oxide in the glasses used, and typically have a glass transition temperature (Tg) of about 300° C. to 400° C. Dielectric compositions designed for use with precious metal conductors usually perform well, both physically and electrically, after firing in oxidizing atmospheres.

Such compositions, however, perform poorly when fired in non-oxidizing atmospheres such as nitrogen, which reduces lead or bismuth oxide to metallic lead or bismuth, which in turn often volatilize. The volatile metal may travel down the length of furnaces used to fire the hybrid circuit and condense onto parts in the cooler sections of the furnace. Moreover, the low glass transition temperature of such glass systems enhances the possibility of binder entrapment through premature fluidity during the firing cycle, thereby sealing over the glassy matrix and not allowing the escape of decomposition products, and promotes the potential for reactivity with base metal electrodes, i.e., dissolution and blistering.

Base metal multi-layer circuitry, particularly copper, offers advantages not available with precious metal systems. For example, conductivity that is approximately equal to silver without the solder leaching and migration problems associated with silver conductor systems. The base metal systems, however, also have their own special disadvantages, particularly vis-a-vis the dielectric compositions.

Base metal compositions must be formulated such that (1) the individual components in the glass or glasses used within the system remain stable when fired in non-oxidizing atmospheres, (2) allow for the removal of the organic decomposition products created by the organic binder, and (3) exhibit compatibility or minimal reactivity with the copper or other base metal conductors being used to fabricate the multi-layer circuitry, while still yielding physical and electrical properties comparable to air-fired systems.

To date, commercially available nitrogen firable dielectric systems utilize refractory oxide filled, single glass compositions. However, these all have been found to exhibit excessive porosity which leads to failure with humidity, and entrapped carbon which promotes copper protuberance growth and electrical shorts.

SUMMARY OF THE INVENTION

This invention relates to a dielectric composition comprising:
(a) about 30% to about 100% by weight of a glass composition selected from the group consisting of:
  (a-1) a bismuth-free, lead-free or low-lead containing glass composition having a glass transition temperature in the range of about 600° C. to about 800° C.;
  (a-2) a mixture of two bismuth-free, lead-free or low-lead containing glass compositions comprising a first glass composition having a glass transition temperature in the range of about 585° C. to about 620° C. and a second glass composition having a glass transition temperature in the range of about 765° C. to about 815° C.; or
  (a-3) a mixture of three bismuth-free, lead-free or low-lead containing glass compositions comprising a first glass composition having a glass transition temperature in the range of about 585° C. to about 620° C., a second glass composition having a glass transition temperature in the range of about 765° C. to about 815° C., and a third glass composition having a glass transition temperature in the range of about 650° C. to about 720° C.;
(b) up to about 30% by weight of at least one expansion modifier; and
(c) up to about 40% by weight of at least one refractory oxide.

This invention also relates to thick film dielectric pastes and dielectric tapes employing the foregoing dielectric composition. The invention also relates to alumina base substrates having the foregoing dielectric composition bonded to at least one surface thereof, and to a method of bonding the foregoing dielectric composition to such alumina base substrates.

DESCRIPTION OF THE PREFERRED EMBODIMENTS

As used herein the term "alumina" or "alumina base substrate" is intended to mean a substrate containing in excess of about 50% by weight alumina. The term "low lead glass" is intended to mean a glass containing about 20% or less by weight lead oxide.

In one embodiment of the invention, the glass (a) is (a-1) a bismuth-free, lead-free or low-lead containing glass composition having a glass transition temperature, Tg, preferably in the range of about 600° C. to about 800° C., more preferably in the range of about 650° C. to about 770° C. This glass preferably has the following composition:

| Oxide | Weight % Preferred | More Preferred |
|---|---|---|
| PbO | 2–18 | 3–14 |
| CaO | 0.5–12 | 1–7 |
| MgO | 3–26 | 5–20 |
| $Al_2O_3$ | 6–30 | 10–25 |
| $SiO_2$ | 43–60 | 48–57 |
| $K_2O$ | 0–3 | 0.2–2 |
| $Na_2O$ | 0–3 | 0.2–2 |
| $B_2O_3$ | 0.2–6 | 0.5–4 |

Specific examples of the glass compositions (a-1) are as follows:

|  | (a-1-1) | (a-1-2) | (a-1-3) | (a-1-4) | (a-1-5) |
|---|---|---|---|---|---|
| PbO | 13.76 | 10.32 | 8.60 | 6.88 | 3.44 |
| CaO | 6.50 | 5.00 | 4.25 | 3.50 | 2.00 |
| MgO | 5.24 | 9.88 | 12.20 | 14.52 | 19.16 |
| $Al_2O_3$ | 12.64 | 16.18 | 17.95 | 19.72 | 23.26 |
| $SiO_2$ | 54.98 | 53.46 | 52.70 | 51.94 | 50.42 |
| $K_2O$ | 1.36 | 1.02 | 0.85 | 0.68 | 0.34 |
| $Na_2O$ | 1.92 | 1.44 | 1.20 | 0.96 | 0.48 |
| $B_2O_3$ | 3.60 | 2.70 | 2.25 | 1.80 | 0.90 |

These glass compositions have the following properties:

|  | (a-1-1) | (a-1-2) | (a-1-3) | (a-1-4) | (a-1-5) |
|---|---|---|---|---|---|
| CTE @ 300° C. ($\times 10^{-7}$/°C.) | 50.0 | 46.8 | 49.3 | 45.1 | 44.3 |
| CTE @ 300° C. ($\times 10^{-7}$/°C.) | 53.3 | 51.8 | 53.5 | 52.0 | 51.4 |
| Tg (°C.) | 670 | 704 | 718 | 733 | 755 |
| DSP (°C.) | 725 | 740 | 760 | 786 | 800 |
| Density (g/cc) | 2.12 | 2.48 | 2.32 | 2.74 | 2.67 |

The term "CTE" refers to coefficient of thermal expansion. The term "CTE @ 300° C." refers to the amount of expansion exhibited by an expansion bar that is heated from room temperature to 300° C. The term "CTE @ 600° C." refers to the amount of expansion exhibited by an expansion bar that is heated from room temperature to 600° C. "DSP" refers to dilatometric softening point. CTE and DSP are measured using a dilatometer. In measuring these thermal properties, the samples are fired in nitrogen at 900° C. with a ten-minute peak temperature using known procedures.

In another embodiment of the invention, the glass (a) is (a-2) a mixture of two bismuth-free, lead-free or low-lead containing glass compositions comprising a first glass composition (a-2-1) having a glass transition temperature in the range of about 585° C. to about 620° C., and a second glass composition (a-2-2) having a glass transition temperature in the range of about 765° C. to about 815° C. These glasses preferably have the following compositions (all numerical values being in percent by weight):

| | Glass (a-2-1) | | Glass (a-2-2) | |
|---|---|---|---|---|
| Oxide | Preferred | More Preferred | Preferred | More Preferred |
| PbO | 14–20 | 16–18 | — | — |
| CaO | 4–12 | 6–10 | 0–2 | 0–1 |
| MgO | 0–3 | 0.5–1 | 20–27 | 22–25 |
| $Al_2O_3$ | 5–12 | 8–10 | 20–31 | 24–29 |
| $SiO_2$ | 45–60 | 52–58 | 43–56 | 47–51 |
| $K_2O$ | 0–3 | 1–2.5 | — | — |
| $Na_2O$ | 0–3 | 1–2.5 | — | — |
| $B_2O_3$ | 2–7 | 3–6 | — | — |

The weight ratio of glass (a-2-1) to glass (a-2-2) is preferably about 7:3 to about 3:7, more preferably about 2:1 to about 1:2, more preferably about 1.5:1 to about 1:1.5, more preferably about 1:1. Specific examples of these glasses are as follows (all numerical values being in percent by weight):

| Oxide | Glass (a-2-1-1) | Glass (a-2-2-1) |
|---|---|---|
| PbO | 17.2 | — |
| CaO | 8.0 | 0.5 |
| MgO | 0.8 | 23.8 |
| $Al_2O_3$ | 9.0 | 26.8 |
| $SiO_2$ | 56.8 | 48.9 |
| $K_2O$ | 1.8 | — |
| $Na_2O$ | 2.3 | — |
| $B_2O_3$ | 4.5 | — |

In another embodiment of the invention, the glass (a) is (a-3) a mixture of three bismuth-free, lead-free or low-lead containing glasses comprising a first glass composition (a-3-1) having a glass transition temperature in the range of about 585° C. to about 620° C., a second glass composition (a-3-2) having a glass transition temperature in the range of about 765° C. to about 815° C., and a third glass composition (a-3-3) having a glass transition temperature in the range of about 650° C. to about 720° C. These glasses preferably have the following compositions (all numerical values being in percent by weight):

| | Glass (a-3-1) | | Glass (a-3-2) | | Glass (a-3-3) | |
|---|---|---|---|---|---|---|
| Oxide | Preferred | More Preferred | Preferred | More Preferred | Preferred | More Preferred |
| PbO | 14–20 | 16–18 | — | — | — | — |
| CaO | 4–12 | 6–10 | 0–2 | 0–1 | 35–65 | 35–55 |
| MgO | 0–3 | 0.5–1 | 20–27 | 22–25 | — | — |
| $Al_2O_3$ | 5–12 | 8–10 | 20–31 | 24–29 | — | — |
| $SiO_2$ | 45–60 | 52–58 | 43–56 | 47–51 | 30–60 | 35–55 |
| $K_2O$ | 0–3 | 1–2.5 | — | — | — | — |
| $Na_2O$ | 0–3 | 1–2.5 | — | — | — | — |
| $B_2O_3$ | 2–7 | 3–6 | — | — | 1–15 | 5–10 |

Glass (a-3-3) preferably has a coefficient of thermal expansion in the range of about $80 \times 10^{-7}$/°C. to about $105 \times 10^{-7}$/°C.

Specific examples of these glasses are as follows (all numerical values being in percent by weight):

| Oxide | Glass (a-3-1-1) | Glass (a-3-2-1) | Glass (a-3-3-1) |
|---|---|---|---|
| PbO | 17.2 | — | — |

-continued

| Oxide | Glass (a-3-1-1) | Glass (a-3-2-1) | Glass (a-3-3-1) |
|---|---|---|---|
| CaO | 8.0 | 0.5 | 40 |
| MgO | 0.8 | 23.8 | — |
| $Al_2O_3$ | 9.0 | 26.8 | — |
| $SiO_2$ | 56.8 | 48.9 | 50 |
| $K_2O$ | 1.8 | — | — |
| $Na_2O$ | 2.3 | — | — |
| $B_2O_3$ | 4.5 | — | 10 |

The weight ratio of glass (a-3-1) to glass (a-3-2) is preferably about 7:3 to about 3:7, more preferably about 2:1 to about 1:2, more preferably about 1.5:1 to about 1:1.5, more preferably about 1:1. The weight ratio of the combined weight of glass (a-3-1) and glass (a-3-2) to the weight of glass (a-3-3) is preferably about 10:1 to about 1.5:1, more preferably about 5:2 to about 7:3.

Each of the above glass compositions (a) can be prepared in any conventional manner. For example, a mixture of the appropriate ingredients can be placed in a platinum crucible and melted (e.g., 1450° C.–1550° C.), the resulting glass composition is then poured onto cold steel rolls to form thin flakes suitable for milling. These flakes are then milled to a suitable particle size distribution (e.g., about 0.5 to about 20 microns).

The inventive dielectric compositions preferably contain from about 30% to about 100% by weight, more preferably about 30% to about 95% by weight, more preferably about 30% to about 85% by weight, more preferably about 30% to about 75% by weight of the glass (a). Advantageously, the inventive dielectric compositions contain about 50% to about 100% by weight, more preferably about 60% to about 100% by weight, more preferably about 60% to about 95% by weight, more preferably about 60% to about 80% by weight of the glass (a).

The inventive dielectric compositions can include an expansion modifier (b) which can be any material which causes the coefficient of thermal expansion of the thick film compositions of the invention to satisfactorily close to that of the alumina substrate. Typical expansion modifiers include $SiO_2$, $CaZrO_3$, $CaSiO_3$, $Mg_2SiO_4$, $CaTiO_3$, $BaZrO_3$ and $SrZrO_3$. $SiO_2$, $Mg_2SiO_4$ and $CaSiO_3$ are preferred. The expansion modifiers are preferably present in the inventive dielectric composition at concentrations of up to about 30% by weight, more preferably about 2% to about 30% by weight, more preferably about 5% to about 30% by weight, more preferably about 10% to about 30% by weight.

The inventive dielectric compositions can also include a refractory oxide (c) which can be any material which is compatible with the thick film composition of the invention and which during heating of the applied composition will permit the binder material to be removed from the thick film composition without deleteriously effecting the same. Typical refractory compositions include $Al_2O_3$, $TiO_2$ and $ZrO_2$, with $Al_2O_3$ being preferred. These refractory oxides are preferably present in the inventive dielectric compositions at concentrations of up to about 40% by weight, more preferably about 2% to about 40% by weight, more preferably about 5% to about 40% by weight, more preferably about 10% to about 40% by weight.

The glass particles (a) and, if used, the expansion modifier (b) and refractory oxide (c), are preferably ball-milled together in a suitable vehicle, such as isopropyl alcohol. This method of milling is well known and results in a homogeneous solids mixture. The solids are dried, then dispersed in a suitable binder or vehicle to form a dielectric paste.

The binder or vehicle is preferably an organic binder or vehicle and is provided in an amount sufficient to disperse the solids in the binder or vehicle and to at least temporarily bond the dielectric composition to a substrate prior to firing. In practice, the solid components, i.e., glass composition (a) and, if used, expansion modifier (b) and refractory oxide (c), are preferably present in the range of from about 60% to about 80% by weight of the inventive dielectric paste compositions and the binder or vehicle is preferably present in an amount ranging from about 20% to about 40% by weight of such dielectric paste composition.

The organic binder or vehicle is usually an organic resin dissolved in a suitable solvent. Any essentially inert binder can be used in the practice of the present invention, including various organic liquids, with or without thickening and/or stabilizing agents and/or other common additives. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil, the monobutyl ether of ethylene glycol monoacetate, and carbinol. The binder can contain volatile liquids to promote fast setting after application to the substrate.

In one embodiment of the invention, the vehicle or binder contains from about 0.1% to about 10% by weight resin and about 90% to about 99.9% by weight solvent or mixture of solvents. The resin can be ethyl cellulose or an acrylate resin (e.g., methyl methacrylate). The solvent can be terpineol, 2,4,4-trimethyl-1,3-pentanediol monoisobutylrate, N-methyl-2-pyrrolidone or mixtures thereof. The vehicle or binder can include a thixotropic material, preferably at a concentration of less than about 0.25% by weight.

The inventive thick film dielectric paste composition is applied to a substrate such as an alumina base substrate in accordance with the invention using techniques well-known to those skilled in the art. An example of such a technique is silk screening wherein the paste is forced through a fine mesh stainless steel screen in a desired pattern. Typically the size of such a screen varies from about 200 to about 325 mesh. Other examples include spraying, dipping, spinning, brushing and application using a doctor blade.

This invention also relates to a method of bonding the inventive dielectric composition to an alumina base substrate comprising applying to at least one surface of said substrate a dielectric paste comprising the inventive dielectric composition, heating the substrate in a non-oxidizing atmosphere (e.g., nitrogen) to a temperature sufficient to permit the glass (a) in the dielectric paste to fuse (e.g., about 800° C. to about 950° C.), and then cooling the substrate to a temperature sufficient to permit the dielectric composition to adhere to the substrate. This invention also relates to an alumina base substrate having the inventive dielectric composition bonded to at least one surface thereof using the foregoing method.

This invention also relates to the use of the inventive dielectric composition in conjunction with base metal conductors, such as copper, to produce a functional electronic circuit on an alumina base substrate.

This invention also provides for a multi-layered circuit comprising a plurality of layers of interconnected electronic circuitry, each of said layers being separated by a dielectric material, the dielectric material comprising the inventive dielectric composition.

This invention also provides for a thick-filmed circuit comprising at least one layer of electronic circuitry in contact with a dielectric material, said dielectric material comprising the inventive dielectric composition.

The inventive dielectric composition when bonded to an alumina substrate, preferably has a dielectric constant (K) of about 4 to about 10, more preferably about 5 to about 8, more preferably about 5.5 to about 6.5; an insulation resistance (IR) of preferably greater than about $10^{11}$, more preferably greater than about $10^{12}$ ohms and typically in the range of about $10^{11}$ to about $10^{13}$ ohms; a dissipation factor (DF) of preferably about 0.2% to about 0.65%, more preferably about 0.3%; a breakdown voltage (BDV) in the range of about 300 to about 1100 volts per mil, more preferably about 300 to about 600 volts per mil, more preferably at least about 500 volts per mil; and a thickness (T) of preferably about 40 to about 100 microns, more preferably about 45 to about 70 microns.

The inventive dielectric pastes are fired in a non-oxidizing atmosphere at a peak temperature preferably in the range of about 875° C. to about 925° C., more preferably about 900° C. to about 905° C. Preferably, firing at the peak temperature is maintained for about 8 to about 12 minutes, more preferably about 9 to about 11 minutes. The heat-up time is preferably about 20 to about 26 minutes, more preferably about 22 to about 26 minutes. The cool-down time is preferably about 22 to about 32 minutes, more preferably about 23 to about 29 minutes. The non-oxidizing atmosphere is preferably nitrogen, but can also be helium or argon. The non-oxidizing atmosphere can include up to about 10 ppm oxygen and up to about 200 ppm $CO_2$, $NO_2$ or $H_2O$ in firing zone. The term "firing" is used herein to mean heating to a temperature and for a time sufficient to volatilize (burnout) all of the organic material in the dielectric paste and to sinter the glass (a) and, if used, the expansion modifier (b) and refractory oxide (c).

The invention also relates to tapes or "green tapes" comprising a flexible substrate and the inventive dielectric composition adhered to the flexible substrate. These tapes are made by casting a dispersion of the inventive dielectric composition in the above-discussed organic binder or vehicle onto a flexible substrate, such as a steel belt or polymeric film, and then heating the cast layer to remove the volatile solvent. In this embodiment of the invention, the solvent preferably has a boiling point below about 150° C. and the heating step used to remove the solvent is conducted at a sufficient temperature to vaporize the solvent. Examples of such solvents include acetone, xylene, methanol, ethanol, isopropanol, methyl ethyl ketone, 1,1,1-trichlorethane, tetrachloroethylene, amyl acetate, 2,2,4-triethyl pentanediol-1,3-monoisobutyrate, toluene, methylene chloride and fluorocarbons. It will be recognized that individual components of the solvent may not be complete solvents for the binder polymer. Yet, when blended with other solvent components, they function as solvents.

The green tape can be used as a dielectric or insulating material for multilayer electronic circuits. A roll of green tape is blanked with registration holes in each corner to a size somewhat larger than the actual dimensions of the circuit. To connect various layers of the multilayer circuit, via holes are formed in the green tape. This is typically done by mechanical punching. However, a sharply focused laser can be used to volatilize the green tape. Typical via hole sizes range from about 0.006" to about 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit elements. Also, high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing can be carried out in a standard thick film conveyor belt furnace.

The inventive dielectric composition can also be used as a glaze. In this embodiment, an article comprising a substrate has a glaze covering at least one surface thereof, the glaze comprising the inventive dielectric composition. An example of such an article is a multilayered circuit covered by such glaze. The glaze or overglaze is useful in enhancing hermiticity. The glaze is preferably printed over the desired surface areas of the composite circuit structure and then fired at the same temperature and using the same firing procedures used in firing the dielectric layers used in building the circuit. The firing temperature for the overglazing step can, however, be less than that used in firing the dielectric layers. Preferably one layer of overglaze is used, but additional layers (e.g., total of 2 or 3 layers) can be used.

In order to further illustrate the invention, Examples 1–42 are provided. Unless otherwise indicated, in the following examples as well as throughout the entire specification and in the appended claims, all parts and percentages are by weight, and all temperatures are in degrees centigrade.

The formulations identified in Tables I–III below are prepared using the glass compositions a-1-1, a-1-2, a-1-3, a-1-4, a-1-5, a-2-1, a-2-2, a-3-1-1, a-3-2-1 and a-3-3-1 identified above. These glass compositions along with the expansion modifiers and refractory oxides identified in Tables I–III are milled in the presence of isopropyl alcohol using standard milling procedures, then dried. The dry solids are blended with an organic vehicle to form dielectric pastes having solids contents of 68.48% by weight and a vehicle or binder content of 31.52% by weight. The organic vehicle or binder has the following ingredients:

|  | Pts./Wt. |
| --- | --- |
| Texanol (product of Eastman Kodak Chemicals identified as 2,4,4-trimethyl-1,3-pentanediol mono-isobutylrate) | 65.28 |
| Alpha-Terpineol (product of Hercules identified as alpha-4-trimethyl-3-cyclohexane-1-methanol) | 1.96 |
| Ethyl Cellulose N-300 (product of Hercules identified as an ethyl cellulose resin) | 0.14 |
| M-Pyrol (product of Jasco Chemical Corp. identified as N-methyl-2-pyrrolidone) | 23.16 |

-continued

| | Pts./Wt. |
|---|---|
| Thixatrol ST (product of NL Industries identified as a low molecular weight amide useful as a thixotropic agent) | 7.01 |
| Elvocite 2045 (product of DuPont identified as a butyl methacrylate resin) | 2.02 |
| Millithix 925 (commercially available polyol acetal) | 0.18 |

Composite structures for each example are prepared as follows. A copper conductor paste, DP50-002 (a product of Ferro Corporation identified as a mixed bonded copper conductor paste) is printed on an alumina substrate. The printed layer is allowed to level at room temperature, and is then dried at about 100° C. The dried printed layer is fired at about 900° C. in a nitrogen atmosphere containing about 1-3 ppm oxygen; the temperature of the printed layer being increased from ambient to about 900° C. over a 25-minute period, maintained at about 900° C. for 10 minutes, then reduced to ambient over a 25-minute period. A first dielectric layer using the dielectric pastes described above and the dielectric compositions reported in Tables I-III is then printed over the conductor layer using the same printing, levelling, drying and firing procedure used for the conductor layer. A second dielectric layer using the same formulation as the first dielectric layer is then printed over the first dielectric layer, the same printing, levelling, drying and firing procedure used for the conductor layer being used. A third dielectric layer using the same formulation as the first dielectric layer is then printed over the second dielectric layer, the same printing, levelling, drying and firing procedure used for the conductor layer being used. A second conductor layer using DP50-009 (a product of Ferro Corporation identified as a mixed bonded copper conductor paste) is then printed over the third dielectric layer using the same printing, levelling, drying and firing procedure as with the first conductor layer. The combined dielectric layers of the resulting composite structures have the thicknesses, T, reported in Tables I and II. The combined dielectric layers of the composite structures reported in Table III have thicknesses of about 55 microns.

The dielectric constant (K) and the dissipation factor (DF) are measured using a Model 4192A Hewlett Packard bridge. The dielectric breakdown voltage (DBV) is determined by increasing the voltage applied across the thickness of the sample until breakdown occurs. A fluke Model 412B high voltage power supply is used. Insulation resistance (IR) is determined using a General Radio Model 1864 Megohmeter at 200 volts D.C. The CTE and DSP are determined using a dilatometer. The terms "CTE @ 300° C." and "CTE @ 600° C." are the same as defined above. The term "CTE @ 900° C." refers to the amount of expansion exhibited by an expansion bar that is heated from room temperature to 900° C. $I_1$ is current leakage through the dielectric film measured using Institute of Printed Circuits test method 2.5.31.

TABLE I

| | 1 | 2 | 3 | 4 | 5 | 6 | 7 | 8 |
|---|---|---|---|---|---|---|---|---|
| Glass a-1-1 | 70 | 70 | 70 | — | — | — | — | — |
| Glass a-1-2 | — | — | — | 70 | 70 | 70 | 70 | — |
| Glass a-1-3 | — | — | — | — | — | — | — | 70 |
| Glass a-1-4 | — | — | — | — | — | — | — | — |
| Glass a-1-5 | — | — | — | — | — | — | — | — |
| Mg$_2$SiO$_4$ | — | 15 | 27 | — | 15 | 20 | — | — |
| CaSiO$_3$ | 15 | — | — | 15 | — | — | 27 | 15 |
| Al$_2$O$_3$ | 15 | 15 | 3 | 15 | 15 | 10 | 3 | 15 |
| CTE @ 300° C. ($\times 10^{-7}$/°C.) | 59.0 | 65.6 | 67.3 | 57.7 | 59.6 | 60.1 | 57.3 | 56.7 |
| CTE @ 600° C. ($\times 10^{-7}$/°C.) | 65.5 | 68.1 | 71.1 | 61.7 | 64.9 | 64.8 | 61.8 | 60.4 |
| CTE @ 900° C. ($\times 10^{-7}$/°C.) | 73.3 | 84.0 | 79.9 | 69.8 | — | — | 67.2 | 65.0 |
| Tg (°C.) | 660 | 670 | 655 | 695 | 698 | 691 | 680 | 715 |
| DSP (°C.) | — | — | — | — | 830 | 800 | — | — |
| Density (g/cc) | 2.76 | 2.80 | 2.72 | 2.70 | 2.70 | 2.65 | 2.60 | 2.65 |
| K | 7.0 | 7.8 | — | 6.4 | 6.6 | — | — | 5.6 |
| DF (%) | 0.23 | 0.22 | — | 0.27 | 0.24 | — | — | 0.32 |
| IR ($\times 10^{12}$ ohms) | 4.1 | 1 | — | 0.014 | 0.033 | — | — | 0.011 |
| BDV/mil (volts) | 536 | 533 | — | 495 | 463 | — | — | 474 |
| Thickness (microns) | 49.9 | 49.1 | — | 54.4 | 59.8 | — | — | 56.3 |

| | 9 | 10 | 11 | 12 | 13 | 14 | 15 | 16 |
|---|---|---|---|---|---|---|---|---|
| Glass a-1-1 | — | — | — | — | — | — | — | — |
| Glass a-1-2 | — | — | — | — | — | — | — | — |
| Glass a-1-3 | 70 | 70 | 70 | — | — | — | — | — |
| Glass a-1-4 | — | — | — | 70 | 70 | 70 | 70 | — |
| Glass a-1-5 | — | — | — | — | — | — | — | 70 |
| Mg$_2$SiO$_4$ | 15 | 27 | — | — | 15 | 20 | — | — |
| CaSiO$_3$ | — | — | 20 | 15 | — | — | 20 | 15 |
| Al$_2$O$_3$ | 15 | 3 | 10 | 15 | 15 | 10 | 10 | 15 |
| CTE @ 300° C. ($\times 10^{-7}$/°C.) | 60.1 | 59.5 | 55.7 | 50.7 | 54.6 | 57.3 | 55.9 | 50.8 |
| CTE @ 600° C. ($\times 10^{-7}$/°C.) | 64.8 | 66.4 | 61.3 | 56.0 | 61.5 | 63.0 | 60.1 | 56.4 |
| CTE @ 900° C. ($\times 10^{-7}$/°C.) | — | — | 64.9 | — | — | — | 63.5 | — |
| Tg (°C.) | 718 | 709 | 710 | 728 | 746 | 732 | 735 | 756 |
| DSP (°C.) | 819 | 790 | — | — | 790 | 805 | — | 819 |

TABLE I-continued

| Density (g/cc) | 2.72 | 2.66 | 2.63 | 2.75 | 2.78 | 2.66 | 2.68 | 2.71 |
|---|---|---|---|---|---|---|---|---|
| K | 5.8 | — | — | 5.3 | 5.1 | — | — | 4.9 |
| DF (%) | 0.25 | — | — | 0.42 | 0.27 | — | — | 0.29 |
| IR ($\times 10^{12}$ ohms) | 0.012 | — | — | 0.0022 | 0.0037 | — | — | 0.01 |
| BDV/mil (volts) | 463 | — | — | 455 | 449 | — | — | 421 |
| Thickness (microns) | 59.8 | — | — | 58.4 | 61.6 | — | — | 65.7 |

TABLE II

| | 17 | 18 | 19 | 20 | 21 | 22 | 23 | 24 | 25 | 26 |
|---|---|---|---|---|---|---|---|---|---|---|
| Glass a-2-1 | 40 | 37.5 | 40 | 37.5 | 40 | 37.5 | 37.5 | 37.5 | 37.5 | 37.5 |
| Glass a-2-2 | 40 | 37.5 | 40 | 37.5 | 40 | 37.5 | 37.5 | 37.5 | 37.5 | 37.5 |
| $CaTiO_3$ | 10 | 15 | — | — | — | — | — | — | — | — |
| $CaZrO_3$ | — | — | 10 | 15 | — | — | — | — | — | — |
| $SrZrO_3$ | — | — | — | — | 10 | 15 | 10 | 7.5 | 5 | — |
| $Al_2O_3$ | 10 | 10 | 10 | 10 | 10 | 10 | 10 | 10 | 10 | 10 |
| $SiO_2$ | — | — | — | — | — | — | 5 | 7.5 | 10 | 15 |
| K | 7.9 | 9.1 | 9.9 | 9.3 | 9.3 | 10.3 | 9.3 | 8.4 | 8.7 | 9.5 |
| IR (ohms) | $>10^{12}$ | $>10^{12}$ | $>10^{12}$ | $>10^{12}$ | $>10^{12}$ | $>10^{13}$ | $>10^{11}$ | $>10^{11}$ | $>10^{11}$ | $>10^{12}$ |
| DF (%) | .54 | .70 | .39 | .33 | .30 | .35 | .54 | .64 | 1.20 | .44 |
| BDV/mil (volts) | 334 | 302 | 367 | 421 | 345 | 293 | 357 | 303 | 313 | 286 |
| T (microns) | 57.7 | 70 | 58.5 | 52.7 | 43.1 | 45.9 | 52.0 | 51.2 | 53.2 | 69.6 |

TABLE III

| | 27 | 28 | 29 | 30 | 31 | 32 | 33 | 34 |
|---|---|---|---|---|---|---|---|---|
| Glass a-3-1-1 | 35 | 34.3 | 34.3 | 34.3 | 25.8 | 29.05 | 27 | 24.8 |
| Glass a-3-2-1 | 35 | 34.3 | 34.3 | 34.3 | 25.8 | 29.05 | 27 | 24.8 |
| Glass a-3-3-1 | 30 | 29.4 | 29.4 | 29.4 | 22.0 | 24.9 | 23.2 | 21.0 |
| $Mg_2SiO_4$ | — | — | — | — | — | — | — | — |
| $CaSiO_3$ | — | — | — | 2 | — | — | — | — |
| $SiO_2$ | — | — | 2 | — | — | — | — | — |
| A-17 Alumina** | — | — | — | — | 24.4 | — | — | 5.9 |
| Aluminalux*** | — | — | — | — | — | 15.0 | 21.0 | 21.6 |
| $TiO_2$ | — | 2 | — | — | — | — | — | — |
| Colorant* | — | — | — | — | 2 | 2 | 1.8 | 1.9 |
| K | 6.2 | — | — | 6.1 | 6.2 | 5.3 | 5.33 | 5.73 |
| DF (%) | 0.3 | — | — | 0.2 | 0.38 | 0.23 | 0.26 | 0.46 |
| BDV/mil (volts) | >700 | — | — | 524 | 498 | 784 | 584 | 400 |
| $I_L$ ($\mu$A/cm$^2$) | 1 | — | — | — | 100 | 64.2 | 3.5 | 37 |

| | 35 | 36 | 37 | 38 | 39 | 40 | 41 | 42 |
|---|---|---|---|---|---|---|---|---|
| Glass a-3-1-1 | 34.3 | 34.3 | 34.3 | 34.3 | 34.3 | 25.8 | 25.8 | 25.8 |
| Glass a-3-2-1 | 34.3 | 34.3 | 34.3 | 34.3 | 34.3 | 25.8 | 25.8 | 25.8 |
| Glass a-3-3-1 | 29.4 | 30.5 | 30.7 | 30.9 | 30.2 | 22.0 | 22.0 | 22.0 |
| $Mg_2SiO_4$ | — | — | — | — | — | — | — | — |
| $CaSiO_3$ | 1.5 | 0.4 | 0.2 | — | 0.7 | — | — | — |
| $SiO_2$ | — | — | — | — | — | — | — | — |
| A-17 Alumina** | — | — | — | — | — | 18.3 | 12.2 | 6.1 |
| Aluminalux*** | — | — | — | — | — | 6.1 | 12.2 | 18.3 |
| $TiO_2$ | — | — | — | — | — | — | — | — |
| Colorant* | 0.5 | 0.5 | 0.5 | 0.5 | 0.5 | 2 | 2 | 2 |
| K | 6.05 | 6.36 | 6.26 | 6.55 | 6.33 | 6.0 | 6.2 | 5.8 |
| DF (%) | 0.52 | 0.25 | 0.39 | 0.37 | 0.32 | 0.27 | 0.29 | 0.31 |
| BDV/mil (volts) | 672 | 762 | 989 | 1110 | 500 | 644 | 402 | 529 |
| $I_L$ ($\mu$A/cm$^2$) | — | — | — | — | 60 | 111 | 106 | 74 |

*Green color No. 6266, Mason Company, East Liverpool, Ohio, U.S.A.
**A-17 Alumina is $Al_2O_3$ powder having an average particle size of 3.63 microns available from Aluminum Company of America.
***Aluminalux is $Al_2O_3$ powder having an average particle size of 0.62 microns available from Aluminum Company of America.

The dielectric compositions disclosed in Examples 1–42 are adherently bonded to the substrate, substantially free of bubbles or pores, and essentially devoid of any carbonized binder.

Advantages of using the inventive dielectric compositions herein include their ability to bond to an alumina base substrate, as well as their low porosity, good wetting properties and good thermal coefficients of expansion. These dielectric compositions exhibit minimal undesirable reactions, such as binder entrapment and reactivity, when fired in non-oxidizing atmospheres and used with base metal conductors such as copper conductors.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. A dielectric composition formed by firing a composition comprising:
   (a) about 30% to about 100% by weight of a glass composition selected from the group consisting of:
      (a-1) a mixture of two compositions comprising a first glass composition having a glass transition temperature in the range of about 585° C. to about 620° C. and a second glass composition having a glass transition temperature in the range of about 765° C. to about 815° C.; or
      (a-2) a mixture of three glass compositions comprising a first glass composition having a glass transition temperature in the range of about 585° C. to about 620° C., a second glass composition having a glass transition temperature in the range of about 765° C. to about 815° C., and a third glass composition having a glass transition temperature in the range of about 650° C. to about 720° C.;
   (b) up to about 30% by weight of at least one expansion modifier; and
   (c) up to about 40% by weight of at least one refractory oxide,
   said first glass composition of (a-1) comprising from about 45% to about 60% by weight $SiO_2$, from about 2% to about 7% by weight $B_2O_3$, from about 14% to about 20% by weight PbO, from about 5% to about 12% by weight $Al_2O_3$, up to about 3% by weight MgO, from about 4% to about 12% by weight CaO, up to about 3% by weight $K_2O$, and up to about 3% by weight $Na_2O$; and said second glass composition of (a-1) comprising from about 43% to about 56% by weight $SiO_2$, from about 20% to about 31% by weight $Al_2O_3$, from about 20% to about 27% by weight MgO, and up to about 2% by weight CaO; and
   said first glass composition of (a-2) comprising from about 45% to about 60% by weight $SiO_2$, from about 2% to about 7% by weight $B_2O_3$, from about 14% to about 20% by weight PbO, from about 5% to about 12% by weight $Al_2O_3$, up to about 3% by weight MgO, from about 4% to about 12% by weight CaO, up to about 3% by weight $K_2O$, and up to about 3% by weight $Na_2O$; said second glass composition of (a-2) comprising from about 43% to about 56% by weight $SiO_2$, from about 20% to about 31% by weight $Al_2O_3$, from about 20% to about 27% by weight MgO, and up to about 2% by weight CaO; and said third glass composition of (a-2) comprising from about 30% to about 60% by weight $SiO_2$, from about 35% to about 65% by weight CaO, and from about 1% to about 15% by weight $B_2O_3$.

2. The dielectric composition of claim 1 wherein said expansion modifier (b) is selected from the group consisting of $SiO_2$, $CaZrO_3$, $CaSiO_3$, $Mg_2SiO_4$, $CaTiO_3$, $BaZrO_3$ and $SrZrO_3$.

3. The dielectric composition of claim 1 wherein said expansion modifier (b) comprises $SiO_2$.

4. The dielectric composition of claim 1 wherein said expansion modifier (b) comprises $CaSiO_3$.

5. The dielectric composition of claim 1 wherein said refractory oxide (c) is selected from the group consisting of $Al_2O_3$, $TiO_2$ and $ZrO_2$.

6. The dielectric composition of claim 1 wherein said dielectric composition is formed by firing said composition at a temperature of between about 875° C. to about 925° C.

7. The dielectric composition of claim 1 wherein said dielectric composition is formed by firing said composition at a temperature of between about 900° C. and 950° C.

8. A dielectric paste comprising at least one binder or vehicle and said composition of claim 1 dispersed in said binder or vehicle.

9. A dielectric paste comprising at least one binder or vehicle and said composition of claim 1 dispersed in said binder or vehicle, said binder or vehicle comprising at least one resin and at least one solvent.

10. The dielectric paste of claim 9 wherein said binder or vehicle comprises from about 0.1% to about 10% by weight of at least one resin and from about 90% to about 99.9% by weight of at least one solvent.

11. The dielectric paste of claim 9 wherein said binder or vehicle further comprises at least one thixotropic agent.

12. The dielectric paste of claim 9 wherein said resin comprises at least one ethyl cellulose or acrylate resin.

13. The dielectric paste of claim 9 wherein said solvent comprises terpineol, 2,4,4-trimethyl-1,3-pentanediol monoisobutylrate, N-methyl-2-pyrrolidone or a mixture of two or more thereof.

14. A dielectric composition formed by firing a composition comprising:
   (a) from about 60% to about 95% by weight of a mixture of two glass compositions, one of said glass compositions having a glass transition temperature in the range of about 585° C. to about 620° C. and comprising from about 45% to about 60% by weight $SiO_2$, from about 2% to about 7% by weight $B_2O_3$, from about 14% to about 20% by weight PbO, from about 5% to about 12% by weight $Al_2O_3$, up to about 3% by weight MgO, from about 4% to about 12% by weight CaO, up to about 3% by weight $K_2O$, and up to about 3% by weight $Na_2O$; and the other of said glass compositions having a transition temperature in the range of about 765° C. to about 815° C. and comprising from about 43% to about 56% by weight $SiO_2$, from about 20% to about 31% by weight $Al_2O_3$, from about 20% to about 27% by weight MgO, and up to about 2% by weight CaO;
   (b) about 2% to about 30% by weight of at least one expansion modifier; and
   (c) about 2% to about 40% by weight of at least one refractory oxide.

15. A dielectric composition formed by firing a composition comprising a mixture of three glass compositions, the first of said glass compositions having a glass transition temperature in the range of about 585° C. to about 620° C. and comprising from about 45% to about 60% by weight $SiO_2$, from about 2% to about 7% by weight $B_2O_3$, from about 14% to about 20% by weight PbO, from about 5% to about 12% by weight $Al_2O_3$, up to about 3% by weight MgO, from about 4% to about 12% by weight CaO, up to about 3% by weight $K_2O$, and up to about 3% by weight $Na_2O$; the second of said glass compositions having a glass transition temperature in the range of about 765° C. to about 815° C. and comprising from about 43% to about 56% by weight SiO$_2$, from about 20% to about 31% by weight Al$_2$O$_3$, from about 20% to about 27% by weight MgO, and up to about 2% by weight CaO; and the third of said glass compositions having a glass transition temperature in the range of about 650° C. to about 720° C. and comprising from about 30% to about 60% by weight SiO$_2$, from about 35% to about 65% by weight CaO, and from about 1% to about 15% by weight B$_2$O$_3$.

16. A composition which upon firing forms a dielectric composition, said composition comprising:
(a) about 30% to about 100% by weight of a mixture of two glass compositions wherein the first of said glass compositions has a glass transition temperature in the range of about 585° C. to about 620° C. and the second of said glass compositions has a glass transition temperature in the range of about 765° C. to about 815° C.;
(b) up to about 30% by weight of an expansion modifying component; and
(c) up to about 40% by weight of a refractory oxide; said first of said glass compositions comprising from about 45% to about 60% by weight SiO$_2$, from about 2% to about 7% by weight B$_2$O$_3$, from about 14% to about 20% by weight PbO, from about 5% to about 12% by weight Al$_2$O$_3$, from about 0% to about 3% by weight MgO, from about 4% to about 12% by weight CaO, from about 0% to about 3% by weight K$_2$O, and from about 0% to about 3% by weight Na$_2$O; and
said second of said glass compositions comprising from about 43% to about 56% by weight SiO$_2$, from about 20% to about 31% by weight Al$_2$O$_3$, from about 20% to about 27% by weight MgO, and from about 0% to about 2% by weight CaO.

17. The composition of claim 11 wherein said expansion modifying component is selected from the group consisting of SiO$_2$, CaZrO$_3$, CaSiO$_3$, Mg$_2$SiO$_4$, CaTiO$_3$, BaZrO$_3$ and SrZrO$_3$.

18. The composition of claim 17 wherein said expansion modifier is CaTiO$_3$.

19. The composition of claim 17 wherein said expansion modifier is CaZrO$_3$.

20. The composition of claim 17 wherein said expansion modifier is BaZrO$_3$.

21. The composition of claim 17 wherein said expansion modifier is SrZrO$_3$.

22. The composition of claim 16 wherein said refractory oxide is selected from a group consisting of Al$_2$O$_3$, TiO$_2$ and ZrO$_2$.

23. The composition of claim 22 wherein said refractory oxide is Al$_2$O$_3$.

24. The composition of claim 16 which further includes an organic binder.

25. A dielectric paste composition which comprises an admixture of finely divided solids and an organic binder wherein the finely divided solids are present in an amount ranging from about 60% to about 80% by weight of the total composition with said binder being present in an amount ranging from about 20% to about 40% by weight, wherein the finely divided solids include (i) about 25% to about 75% by weight of a mixture of two glass compositions wherein the first glass has a glass transition temperature in the range of about 585° C. to about 620° C. and the second glass has a glass transition temperature in the range of about 765° C. to about 815° C., (ii) up to about 30% by weight of an expansion modifying component, (iii) up to about 40% by weight of refractory oxide, and wherein the binder includes an organic resinous material and a suitable solvent therefor;
said first glass comprising from about 45% to about 60% by weight SiO$_2$, from about 2% to about 7% by weight B$_2$O$_3$, from about 14% to about 20% by weight PbO, from about 5% to about 12% by weight Al$_2$O$_3$, up to about 3% by weight MgO, from about 4% to about 12% by weight CaO, up to about 3% by weight K$_2$O, and up to about 3% by weight Na$_2$O; and said second glass comprising from about 43% to about 56% by weight SiO$_2$, from about 20% to about 31% by weight Al$_2$O$_3$, from about 20% to about 27% by weight MgO, and up to about 2% by weight CaO.

26. The dielectric paste composition of claim 25 wherein said resinous material is present in an amount ranging from about 0.1% to about 10.0% by weight of said binder and said solvent is present in an amount ranging from about 90.0% to about 99.9% by weight of said binder.

27. The dielectric paste composition of claim 26 wherein said resinous material includes about 0% to about 10.0% by weight ethyl cellulose and from about 0% to about 10.0% by weight acrylate resin.

28. The dielectric paste composition of claim 27 which further contains a thixotropic material.

29. The dielectric paste composition of claim 28 wherein said thixotropic material is present in an amount of less than 0.25% by weight of said binder.

* * * * *